(12) United States Patent
Hioka et al.

(10) Patent No.: US 10,062,836 B2
(45) Date of Patent: Aug. 28, 2018

(54) MAGNETIC SENSOR AND METHOD OF MANUFACTURING THE SAME

(71) Applicant: SII Semiconductor Corporation, Chiba (JP)

(72) Inventors: Takaaki Hioka, Chiba (JP); Mika Ebihara, Chiba (JP); Hiroshi Takahashi, Chiba (JP); Matsuo Kishi, Chiba (JP); Miei Takahama, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/458,578

(22) Filed: Mar. 14, 2017

(65) Prior Publication Data
US 2017/0271575 A1 Sep. 21, 2017

(30) Foreign Application Priority Data
Mar. 15, 2016 (JP) .................. 2016-051499

(51) Int. Cl.
*H01L 43/04* (2006.01)
*H01L 43/06* (2006.01)
*H01L 43/14* (2006.01)
*G01R 33/07* (2006.01)
*G01R 33/00* (2006.01)

(52) U.S. Cl.
CPC ........ *H01L 43/065* (2013.01); *G01R 33/0052* (2013.01); *G01R 33/07* (2013.01); *H01L 43/14* (2013.01)

(58) Field of Classification Search
None
See application file for complete search history.

(56) References Cited

U.S. PATENT DOCUMENTS 5,198,795 A * 3/1993 Shibasaki ............ H01L 43/065
257/E43.003
9,546,090 B1 1/2017 Xia et al.
(Continued)

FOREIGN PATENT DOCUMENTS

JP 2002-071381 A 3/2002
WO WO 2007/119569 A 10/2007

OTHER PUBLICATIONS

Office Action in U.S. Appl. No. 15/458,499, dated Dec. 6, 2017, 8 pages.

*Primary Examiner* — Duy T Nguyen
*Assistant Examiner* — Bo Bin Jang
(74) *Attorney, Agent, or Firm* — Brinks Gilson & Lione

(57) ABSTRACT

The magnetic sensor includes a semiconductor substrate having Hall elements on a front surface of the semiconductor substrate, a conductive layer formed on a back surface of the semiconductor substrate, and a magnetic flux converging plate formed on the conductive layer. The magnetic flux converging plate is formed on the back surface of the semiconductor substrate through formation of the base conductive layer on the back surface of the semiconductor substrate, formation of a resist on the base conductive layer having an opening for forming the magnetic flux converging plate, formation of the magnetic flux converging plate in the opening of the resist by electroplating, removal of the resist, and removal of a part of the base conductive layer by etching with the magnetic flux converging plate as a mask.

6 Claims, 3 Drawing Sheets

(56) References Cited

U.S. PATENT DOCUMENTS

2002/0021124 A1\* 2/2002 Schott .................... G01D 5/145
324/207.2
2014/0367813 A1\* 12/2014 Ryu ........................ H01L 43/04
257/421

\* cited by examiner

MAGNETIC SENSOR AND METHOD OF MANUFACTURING THE SAME

RELATED APPLICATIONS

This application claims priority under 35 U.S.C. § 119 to Japanese Patent Application No. 2016-051499 filed on Mar. 15, 2016, the entire content of which is hereby incorporated by reference.

BACKGROUND OF THE INVENTION

1. Field of the Invention

The present invention relates to a magnetic sensor using Hall elements, and to a method of manufacturing the magnetic sensor, in particular, to a magnetic sensor having a magnetic flux converging plate, and is configured to detect vertical and horizontal magnetic fields, and to a method of manufacturing the magnetic sensor.

2. Description of the Related Art

Hall elements are used in various applications since non-contact position detection and non-contact angle detection can be made by Hall elements as magnetic sensors.

First, the principle of magnetic detection with the Hall elements is described. When a magnetic field is applied vertically to a current flowing through a substance, an electric field (Hall voltage) is generated in a direction vertical to both the current and the magnetic field. Typical Hall elements are thus configured to detect a vertical magnetic field component with a current caused to flow on a surface of a substrate or a wafer made of silicon or other material.

In addition, it is known that the Hall elements can detect not only a vertical magnetic field but also a horizontal magnetic field in combination with a magnetic thin film made of a material having high magnetic permeability, with use of the magnetic thin film as a magnetic flux converging plate configured to change a direction of a magnetic flux to guide the magnetic flux to the Hall elements (see, for example, Japanese Patent Application Laid-open No. 2002-071381).

The magnetic sensor including the magnetic flux converging plate may be manufactured as follows. For example, the Hall elements are formed on the silicon substrate, and then the magnetic flux converging plate is formed on the silicon substrate by electroplating. Alternatively, a protective film made of polyimide or other materials is formed on a front surface of the silicon substrate, and the magnetic flux converging plate is formed on the protective film by electroplating (for example, see WO 07/119569 A1).

When the magnetic flux converging plate is formed on the silicon substrate having the Hall elements formed thereon, large stress is generated on the silicon substrate because the thermal expansion coefficients of a metal magnetic body and the silicon substrate or the protective film made of polyimide or other materials are significantly different from each other. The stress affects the magnetic sensor, increasing shift or fluctuations in the magnetic characteristics.

SUMMARY OF THE INVENTION

In view of this, the present invention has made to provide a magnetic sensor capable of suppressing an influence due to stress to achieve less shift or fluctuations in magnetic characteristics, and to provide a method of manufacturing the magnetic sensor.

According to one embodiment of the present invention, there is provided a magnetic sensor, including: a semiconductor substrate including Hall elements on a front surface of the semiconductor substrate; a conductive layer formed on a back surface of the semiconductor substrate; and a magnetic flux converging plate formed on the conductive layer.

According to one embodiment of the present invention, there is provided a method of manufacturing a magnetic sensor, the method including: forming Hall elements on a front surface of a semiconductor substrate; forming a base conductive layer on a back surface of the semiconductor substrate; forming, on the base conductive layer, a resist having an opening for forming a magnetic flux converging plate; forming a magnetic flux converging plate in the opening by performing electroplating under a state in which the resist is formed; removing the resist; and removing a part of the base conductive layer by etching with use of the magnetic flux converging plate as a mask.

According to one embodiment of the present invention, the magnetic flux converging plate is formed on the back surface of the semiconductor substrate including the Hall elements on the front surface thereof. Thus, stress generated due to a difference in thermal expansion coefficients between the semiconductor substrate and the magnetic flux converging plate is applied to the semiconductor substrate from the back surface side. As a result, stress to be applied to the Hall elements formed on the front surface side of the semiconductor substrate can be suppressed by the amount of the thickness of the semiconductor substrate. Time-dependent change or fluctuations in the magnetic characteristics of the magnetic sensor can thus be reduced.

DETAILED DESCRIPTION OF THE PREFERRED EMBODIMENTS

A detailed description is now given of an embodiment of the present invention with reference to the drawings.

Figure 1:
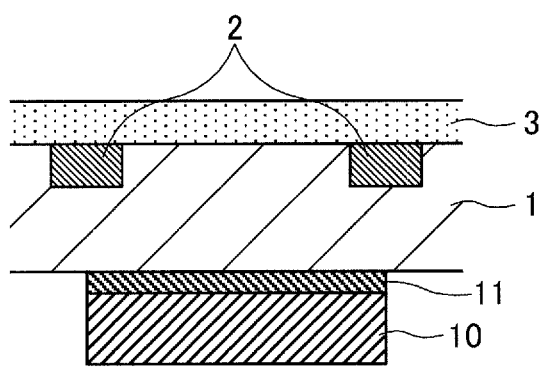
FIG. 1 is a sectional view for illustrating the structure of a magnetic sensor according to an embodiment of the present invention.

FIG. 1 is a sectional view for illustrating the structure of a magnetic sensor according to the embodiment of the present invention.

As illustrated in FIG. 1, the magnetic sensor according to this embodiment includes a semiconductor substrate 1, a pair of Hall elements 2, which is formed on a front surface of the semiconductor substrate 1, and is formed so as to be separated from each other, a protective film 3 covering the front surface of the semiconductor substrate 1 including the Hall elements 2, a conductive layer 11 formed on a back surface of the semiconductor substrate 1, and a magnetic flux converging plate 10 formed on the back surface of the semiconductor substrate 1 through intermediation of the conductive layer 11.

In this embodiment, the semiconductor substrate 1 is a P-type semiconductor substrate, and each of the Hall elements 2 is a horizontal Hall element including a square or cross-shaped vertical magnetic field sensing portion having a four-fold rotational axis, and, at respective vertices and end portions thereof, vertical magnetic field detection control current input terminals and vertical magnetic field Hall voltage output terminals corresponding to surface N-type highly-doped regions having the same shape.

The positional relationship between the Hall elements and the magnetic flux converging plate is important in order to achieve a magnetic sensor having small fluctuations in characteristics. The magnetic flux converging plate 10 is formed so as to overlap with at least a part of each of the pair of Hall elements 2 in plan view.

With this configuration, stress generated due to a difference in thermal expansion coefficients between the semiconductor substrate 1 and the magnetic flux converging plate 10 is applied to the semiconductor substrate 1 from the back surface side. As a result, stress to be applied to the Hall elements 2 formed on the front surface of the semiconductor substrate 1 may be suppressed by the amount of the thickness of the semiconductor substrate 1. In this manner, the magnetic sensor having small temporal change or fluctuations in the magnetic characteristics may be obtained.

In this case, when the thickness of the semiconductor substrate 1 is excessively large, the distance between the magnetic flux converging plate 10 and the Hall elements 2 formed on the front surface of the semiconductor substrate 1 is increased, and thus the sensitivity of the magnetic sensor may not be sufficient. Further, when the thickness of the semiconductor substrate 1 is excessively small, the stress applied to the Hall elements 2 formed on the front surface of the semiconductor substrate 1 is increased. The thickness of the semiconductor substrate 1 is thus preferred to be from about 100 µm to about 400 µm.

Further, when the thickness of the magnetic flux converging plate 10 is excessively small, the sensitivity of the magnetic sensor is decreased. Further, when the thickness of the magnetic flux converging plate 10 is excessively large, the influence due to stress is increased. The thickness of the magnetic flux converging plate 10 is thus preferred to be from about 20 µm to about 50 µm.

Next, a method of manufacturing the magnetic sensor illustrated in FIG. 1 is described with reference to FIG. 2A to FIG. 2F.

FIG. 2A to FIG. 2F are sectional views for illustrating steps of the method of manufacturing a magnetic sensor according to this embodiment.

Figure 2A:
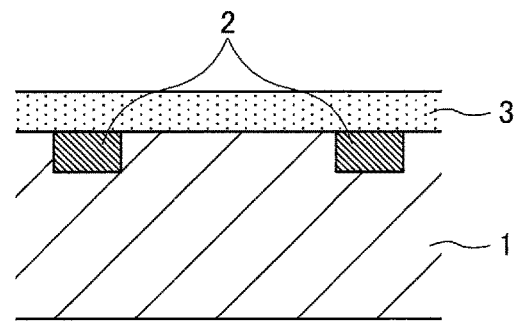
FIG. 2A, FIG. 2B, FIG. 2C, FIG. 2D, FIG. 2E and FIG. 2F are sectional views for illustrating steps of a method of manufacturing a magnetic sensor according to the embodiment of the present invention.

First, as illustrated in FIG. 2A, on the front surface of the P-type semiconductor substrate 1, the Hall elements 2 and a peripheral circuit (not shown), for example, a control circuit for the Hall elements 2, are formed by a normal semiconductor manufacturing process.

Figure 2B:
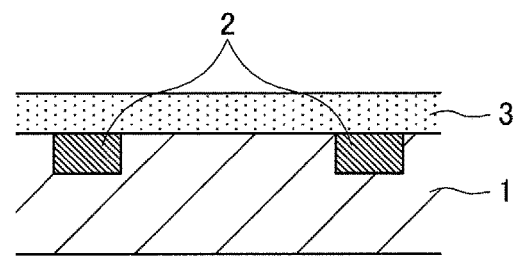

Then, as illustrated in FIG. 2B, the back surface of the semiconductor substrate 1, which has the Hall elements 2 and the peripheral circuit formed thereon, is ground, to thereby reduce the thickness of the semiconductor substrate 1 to from about 100 µm to about 400 µm.

Figure 2C:
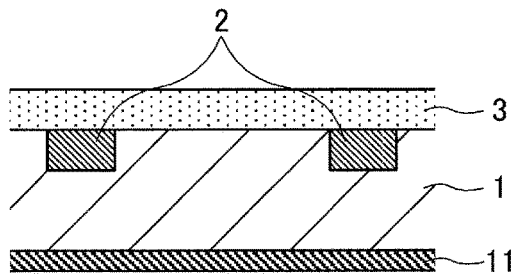

Next, as illustrated in FIG. 2C, the base conductive layer 11 for the magnetic flux converging plate 10 is formed on the back surface of the semiconductor substrate 1. In this case, the base conductive layer 11 for the magnetic flux converging plate 10 serves as an electrode for electroplating. The thickness of the base conductive layer 11 is preferred to be from about 0.3 µm to about 1.0 µm in order to suppress stress.

Figure 2D:
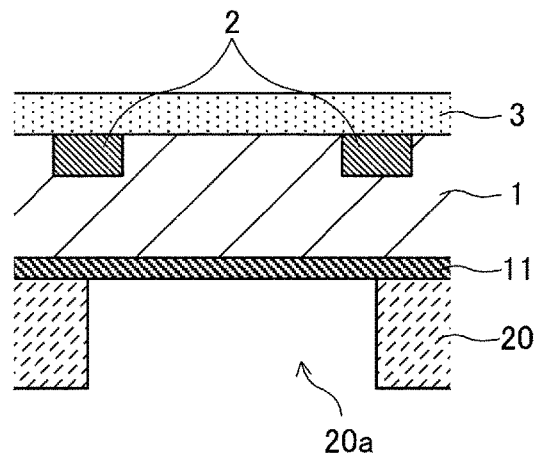

Next, as illustrated in FIG. 2D, a resist 20 having an opening 20a (hereinafter also referred to as "opening for forming the magnetic flux converging plate") with a shape of the magnetic flux converging plate 10 to be formed is formed by photolithography. At this time, an alignment mark formed on the semiconductor substrate 1 may be aligned with an alignment mark formed on an exposure mask for patterning the resist 20 formed on the back surface of the semiconductor substrate 1. In this manner, the opening 20a for forming the magnetic flux converging plate can be formed at a desired position with high accuracy. In this case, the thickness of the resist 20 is required to be larger than the thickness of the magnetic flux converging plate 10 to be formed, and hence the thickness of the resist 20 is desired to be from about 30 µm to about 60 µa.

Figure 2E:
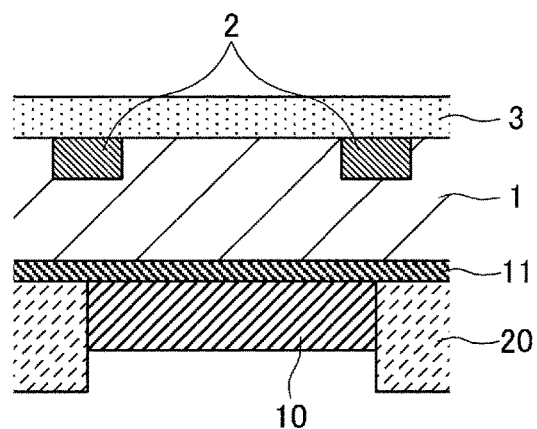

Next, as illustrated in FIG. 2E, the magnetic flux converging plate 10 having a thickness of from about 20 µm to about 50 µm is formed in the opening 20a of the resist 20 by electroplating. The magnetic flux converging plate 10 is desired to be made of a soft magnetic material having low coercive force and high magnetic permeability, for example, permalloy or supermalloy.

Figure 2F:
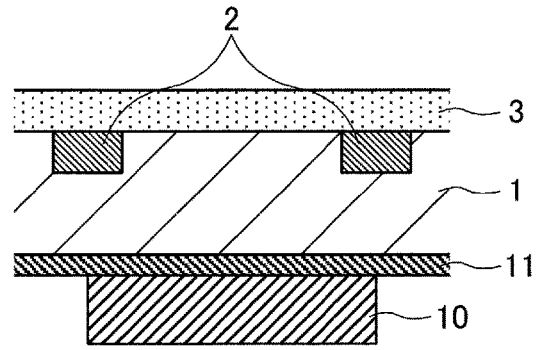

Then, as illustrated in FIG. 2F, the resist 20 is removed to obtain the magnetic flux converging plate 10 having a desired shape.

Further, unnecessary part of the base conductive layer 11 is removed by etching with use of the magnetic flux converging plate 10 as a mask. In this manner, the magnetic flux converging plate 10 is formed in a desired region as illustrated in FIG. 1.

As described above, with this embodiment, the magnetic sensor having small fluctuations or shift in magnetic characteristics due to stress, and the method of manufacturing the magnetic sensor may be provided. Further, the magnetic flux converging plate may be formed by photolithography and electroplating, and hence the manufacturing cost may also be reduced.

The embodiment of the present invention has been described above, but the present invention is not limited to the above-mentioned embodiment, and various modifications can be made thereto without departing from the gist of the present invention.

For example, in the above-mentioned embodiment, the protective film 3 is formed, but the protective film 3 may be omitted.

Further, in the above-mentioned embodiment, an example in which the P-type semiconductor substrate is used as the semiconductor substrate 1 is described, but an N-type semiconductor substrate may be used.

What is claimed is:

1. A magnetic sensor, comprising:
   a semiconductor substrate including Hall elements in the semiconductor substrate, the Hall elements having an exposed surface at a front surface of the semiconductor substrate;
   a conductive layer on a back surface of the semiconductor substrate; and
   a magnetic flux converging plate on the conductive layer adjacent to the back surface of the semiconductor substrate; and
   a protective film contacting the front surface of the semiconductor substrate, wherein the exposed surface of the Hall elements contact the protective film and the magnetic flux converging plate is at an opposite side of the substrate from the protective film.

2. A magnetic sensor according to claim 1, wherein the semiconductor substrate has a thickness of from 100 µm to 400 µm.

3. A magnetic sensor according to claim 1, wherein the magnetic flux converging plate has a thickness of from 20 µm to 50 µm.

4. A method of manufacturing a magnetic sensor, the method comprising:
- forming Hall elements in a semiconductor substrate, the Hall elements having an exposed surface at a front surface of the semiconductor substrate;
- forming a protective film contacting the front surface of the semiconductor substrate and contacting the exposed surface of the Hall elements;
- forming a base conductive layer on a back surface of the semiconductor substrate;
- forming, on the base conductive layer, a resist having an opening for forming a magnetic flux converging plate;
- forming a magnetic flux converging plate in the opening by performing electroplating under a state in which the resist is formed such that the magnetic flux converging plate is arranged adjacent to the back surface of the semiconductor substrate and at an opposite side to the protective film;
- removing the resist; and
- removing a part of the base conductive layer by etching with the magnetic flux converging plate as a mask.

5. A method of manufacturing a magnetic sensor according to claim 4, further comprising grinding the back surface of the semiconductor substrate so that the semiconductor substrate has a thickness of from 100 μm to 400 μm.

6. A method of manufacturing a magnetic sensor according to claim 4, wherein the magnetic flux converging plate has a thickness of from 20 μm to 50 μm.

* * * * *